(12) United States Patent
Hassan

(10) Patent No.: US 12,647,104 B2
(45) Date of Patent: Jun. 2, 2026

(54) PHASED ARRAY TRANSMITTER

(71) Applicant: QUALCOMM INCORPORATED, San Diego, CA (US)

(72) Inventor: Muhammad Hassan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 18/611,303

(22) Filed: Mar. 20, 2024

(65) Prior Publication Data

US 2025/0300633 A1 Sep. 25, 2025

(51) Int. Cl.
| | |
|---|---|
| *H03H 11/16* | (2006.01) |
| *H03F 3/24* | (2006.01) |
| *H03G 3/30* | (2006.01) |

(52) U.S. Cl.
CPC ............. *H03H 11/16* (2013.01); *H03F 3/245* (2013.01); *H03F 2200/336* (2013.01); *H03G 3/3042* (2013.01); *H03G 2201/103* (2013.01)

(58) Field of Classification Search
CPC ........ H03H 11/16; H03H 11/18; H03H 11/20; H03F 3/24; H03F 3/245; H03F 3/193; H04B 1/04; H01Q 3/26; H01Q 3/28; H01Q 3/30; H01Q 3/36; H01P 1/18
USPC ................ 327/231, 237, 238, 254, 255, 256
See application file for complete search history.

(56) References Cited

U.S. PATENT DOCUMENTS

| | | | |
|---|---|---|---|
| 4,020,500 | A | 4/1977 | Harwood |
| 4,177,464 | A | 12/1979 | Masak |
| 10,784,636 | B1 | 9/2020 | Vigilante et al. |
| 11,545,950 | B2 | 1/2023 | Saha |
| 12,294,334 | B2 * | 5/2025 | Park .......................... H03C 3/40 |
| 2008/0287077 | A1 | 11/2008 | Grundlingh et al. |
| 2022/0384956 | A1 | 12/2022 | Alpman et al. |
| 2023/0095788 | A1 * | 3/2023 | Wang ....................... H01Q 3/36 |
| | | | 343/702 |
| 2024/0322795 | A1 * | 9/2024 | Hassan ..................... H03F 3/24 |

FOREIGN PATENT DOCUMENTS

WO 2013130671 A1 9/2013

OTHER PUBLICATIONS

International Search Report and Written Opinion—PCT/US2025/019924—ISA/EPO—Jul. 7, 2025.

* cited by examiner

*Primary Examiner* — Hai L Nguyen

(74) *Attorney, Agent, or Firm* — Smith Tempel Blaha LLC/Qualcomm

(57) ABSTRACT

A phase shifter including a quadrature generator configured to generate an in phase (I) signal and a quadrature (Q) signal from an input signal; an in phase vector modulator (VM_I) configured to receive the I signal and a quadrature vector modulator (VM_Q) configured to receive the Q signal; and an auxiliary VM_I connected to the VM_I and an auxiliary VM_Q connected to the VM_Q, the auxiliary VM_I configured to receive the I signal, the auxiliary VM_Q configured to receive the Q signal, the auxiliary VM_I and the auxiliary VM_Q configured to receive a bias signal and configured to adjust an in phase amplitude output of the VM_I and a quadrature amplitude output of the VM_Q responsive to the bias signal.

20 Claims, 11 Drawing Sheets

Adaptive bias

800

START

GENERATE IN PHASE AND QUADRATURE
AMPLITUDES WITH VECTOR MODULATOR
802

GENERATE AUXILIARY IN PHASE AND AUXILIARY
QUADRATURE AMPLITUDES RESPONSIVE TO
AMPLITUDE OF INPUT SIGNAL WITH AUXILIARY
VECTOR MODULATOR
804

ADJUST IN PHASE AND QUADRATURE AMPLITUDES
WITH OUTPUT FROM AUXILIARY VECTOR
MODULATOR
806

END

PHASED ARRAY TRANSMITTER

FIELD

The present disclosure relates generally to electronics, and more specifically to transmitters in transceivers.

BACKGROUND

Wireless communication devices and technologies are becoming ever more prevalent as are communication systems that operate at millimeter-wave (mmW) and at near-mmW frequencies or at frequencies higher than mmW. Next-generation millimeter-wave (mm-Wave) power amplifiers (PAs) should support multi-standard communication systems with wide bandwidth, complex modulation, and high energy efficiency. In order to support transmitting using higher order modulation (64-QAM/256-QAM), high linearity and superior noise performance is needed simultaneously to meet error vector magnitude (EVM) requirements at both maximum power (Pmax) and near minimum power (Pmin).

Amplitude modulation (AM) to AM distortion is generally easily compensated, but AM to phase modulation (PM) distortion presents additional challenges in that AM to PM distortion occurs when variations in the amplitude of the power amplifier (PA) input signal lead to a phase change at the output of the PA. AM to PM distortion can limit the Pmax region EVM. In the past, AM to PM distortion was compensated by adding a varactor at the input of the power amplifier. However, this comes at the expense of additional loading at the input of the PA and PA gain drop and still does not fully cancel AM to PM distortion. In addition, the absence of a robust mm-Wave (or shorter wave) phase-invariant gain control solution also limits the EVM near Pmin because at lower power the intermediate frequency (IF) gain is lowered instead of the mm-Wave gain, thus limiting the overall noise performance of the transmitter.

Therefore, an efficient phase-invariant gain control solution and a solution to minimize AM to PM distortion is desired.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a phase shifter including a quadrature generator configured to generate an in phase (I) signal and a quadrature (Q) signal from an input signal; an in phase vector modulator (VM_I) configured to receive the I signal and a quadrature vector modulator (VM_Q) configured to receive the Q signal; and an auxiliary VM_I connected to the VM_I and an auxiliary VM_Q connected to the VM_Q, the auxiliary VM_I configured to receive the I signal, the auxiliary VM_Q configured to receive the Q signal, the auxiliary VM_I and the auxiliary VM_Q configured to receive a bias signal and configured to adjust an in phase amplitude output of the VM_I and a quadrature amplitude output of the VM_Q responsive to the bias signal.

Another aspect of the disclosure provides a method for signal transmission including generating an in phase (I) amplitude and a quadrature (Q) amplitude based on an input signal; generating an auxiliary in phase amplitude and an auxiliary quadrature amplitude based on the input signal and a gain signal; and adjusting the in phase amplitude using the auxiliary in phase amplitude and adjusting the quadrature amplitude using the auxiliary quadrature amplitude.

Another aspect of the disclosure provides a device including means for generating an in phase (I) amplitude and a quadrature (Q) amplitude based on an input signal; means for generating an auxiliary in phase amplitude and an auxiliary quadrature amplitude based on the input signal and a gain signal; and means for adjusting the in phase amplitude using the auxiliary in phase amplitude and adjusting the quadrature amplitude using the auxiliary quadrature amplitude.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In an exemplary embodiment, a phased array transmitter includes a vector modulator and an auxiliary vector modulator. The auxiliary vector modulator may be configured to receive a bias signal and may be configured to adjust an output of the vector modulator responsive to the bias signal.

In an exemplary embodiment, the bias signal provided to the auxiliary vector modulator may be responsive to an input signal level provided to the vector modulator and to the auxiliary vector modulator.

In an exemplary embodiment, the auxiliary vector modulator compensates for AM to PM distortion responsive to the input signal level.

Figure 1:
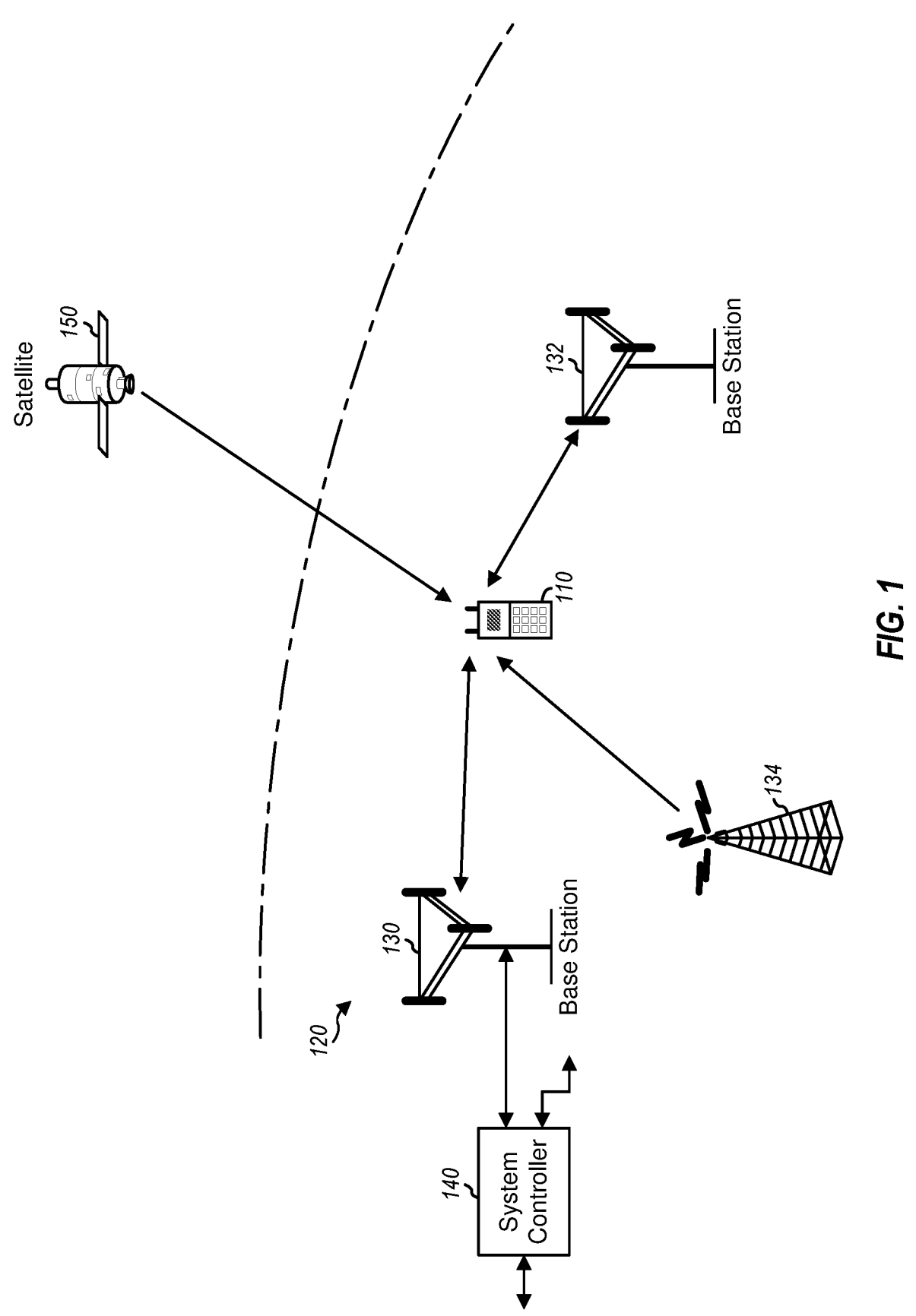
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc.). Wireless device 110 may support one or more radio technologies for wireless communication such as LTE, WCDMA, CDMA 1x, EVDO, TD-SCDMA, GSM, 802.11, 802.15, 5G, Sub6 5G, 6G, Ultra Wideband (UWB), etc.

Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
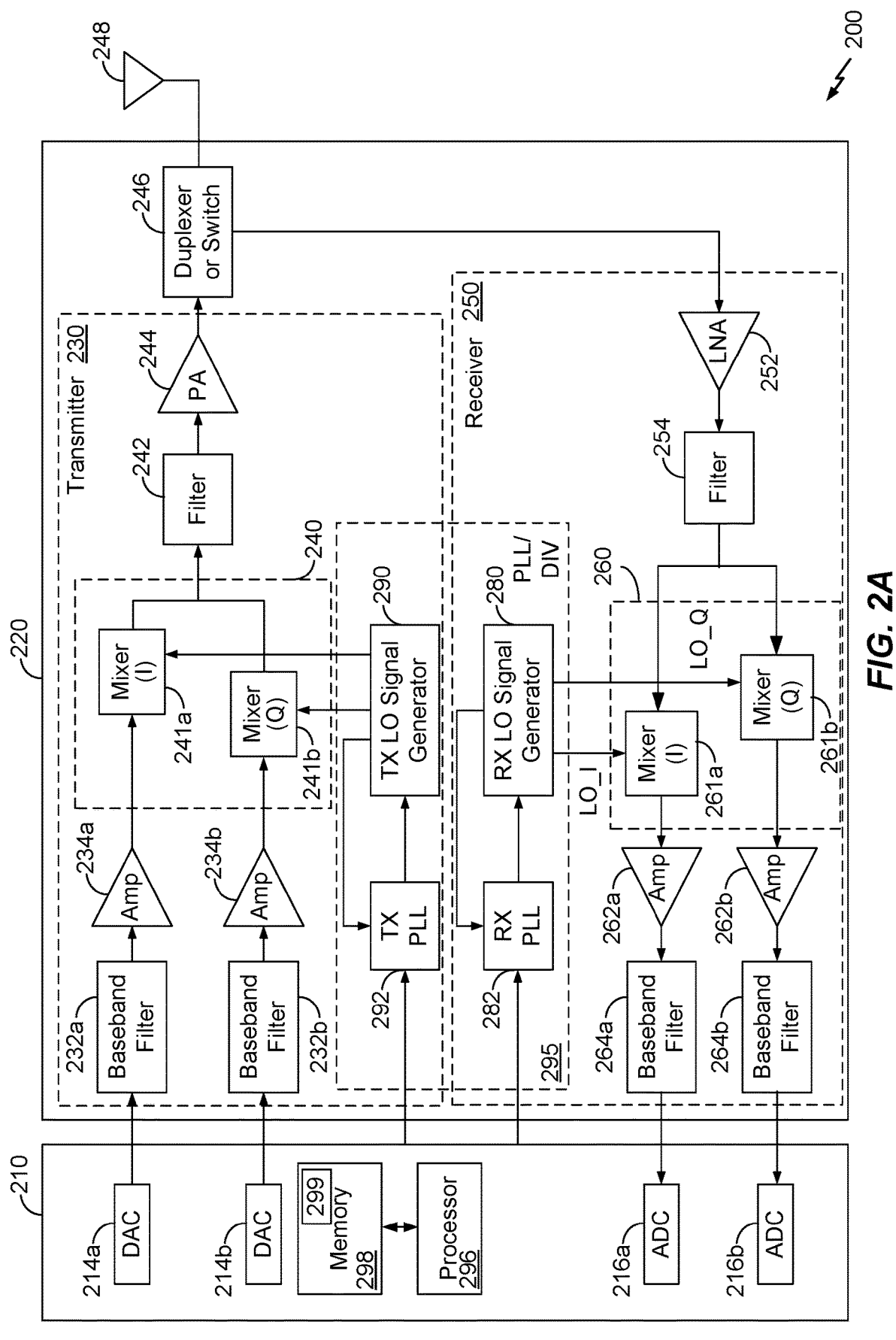
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250, for example phase shifters as discussed further below. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248, or alternatively it can be sent to a separate transmit antenna different from a separate receive antenna. While examples discussed herein utilize I and Q signals, those of skill in the art will understand that components of the transceiver may be configured to utilize polar modulation.

In the receive path, antenna 248 receives communication signals and provides a received RF signal, which can be routed through duplexer or switch 246 and provided to a low noise amplifier (LNA) 252. The duplexer 246 is designed to operate with a specific RX-to-TX duplexer frequency separation, such that RX signals are isolated from TX signals. Alternatively, there may be a separate transmit antenna and separate receive antenna as mentioned above, in which case RX-to-TX isolation can be achieved through the limited coupling between the two antennas. In the case of separate RX and TX antennas, the RX antenna can be coupled directly to LNA 252. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 2B.

Figure 2B:
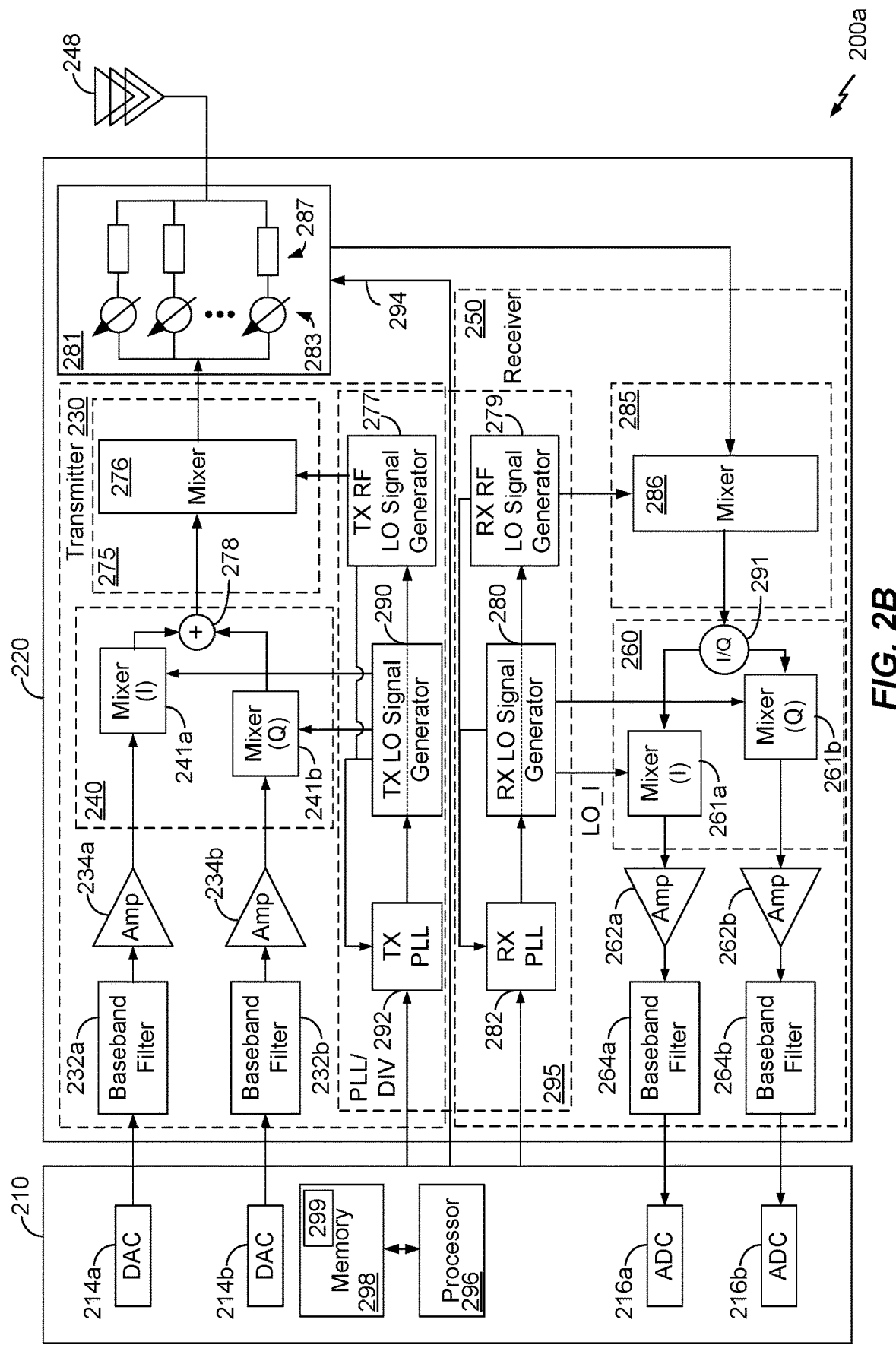
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise upconversion mixer 276. The summing function 278 of upconverter 240 combines the I and the Q outputs and provides a combined signal to the mixer 276. The combined signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287. Exemplary embodiments of the phased array transmitter described herein may be implemented in the phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a down-conversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 of downconverter 260 receives the IF signal from the mixer 286 and generates I and Q signals in downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit or the chip may be mounted on the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 7 GHz (e.g., the FR1 frequency band) using the architecture illustrated in FIG. 2A and to communicate with signals having a frequency above about 24 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 2C:
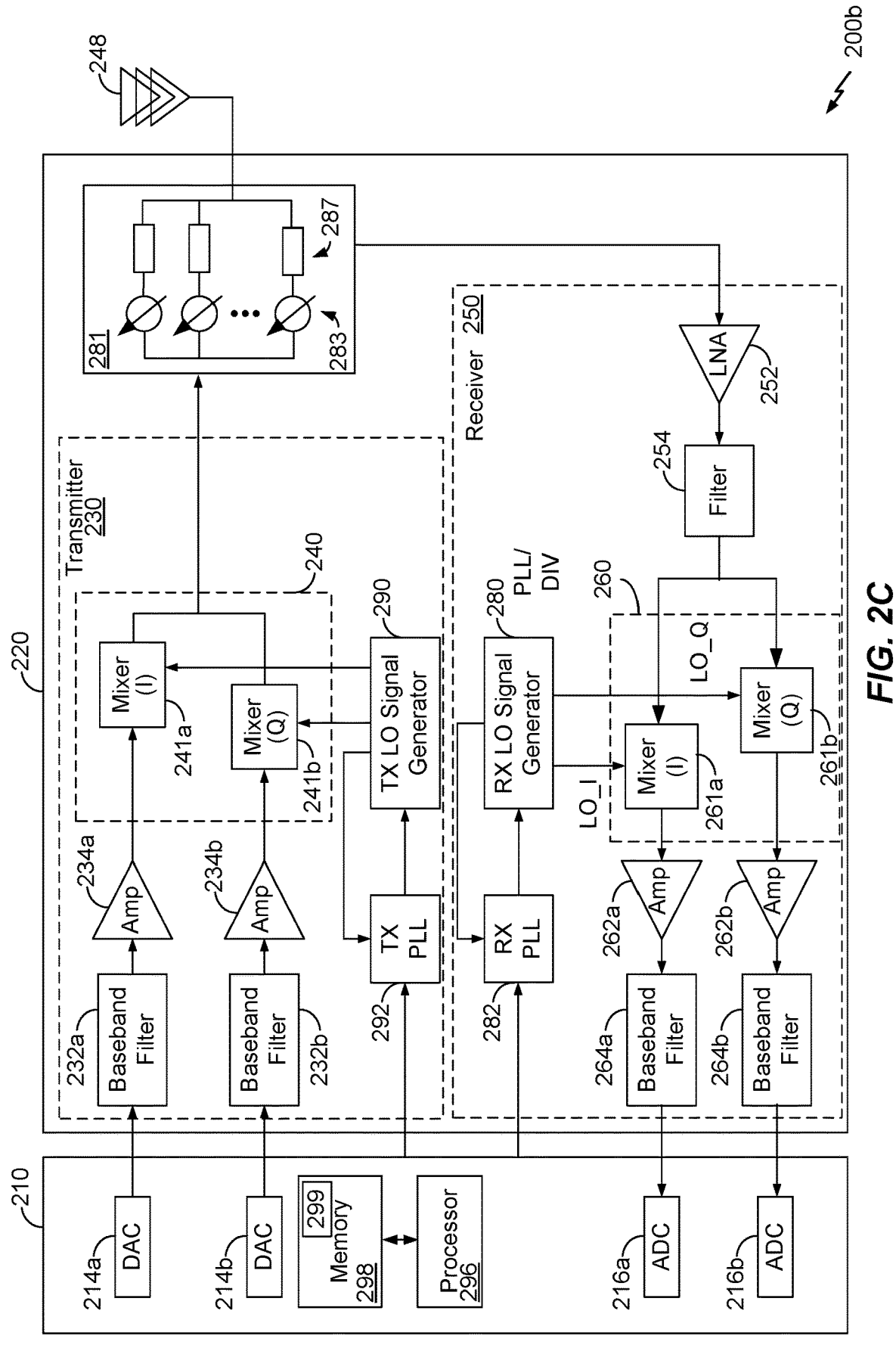
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200b in FIG. 2C may be configured similarly to those in the wireless device 200 shown in FIG. 2A and/or the wireless device 200a shown in FIG. 2B and the description of identically numbered items in FIG. 2C will not be repeated.

The wireless device 200b in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. Such an architecture may be referred to as a low IF (LIF), or a zero IF (ZIF) architecture. For example, the LO signals in the architecture of FIG. 2C may comprise signals at frequencies of tens of GHz. In other examples, the LO signals may be a single digit or low double digit GHz frequency (for example, when the wireless device 200b is configured for use with signals in an FR3 band) or hundreds of GHz (for example, when the wireless device 200b is configured for use with signals in a sub-THz band).

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate. In some embodiments, multiple iterations of the upconverter 240 and downconverter 260 may be implemented to process multiple signals on different frequency bands.

Figure 3:
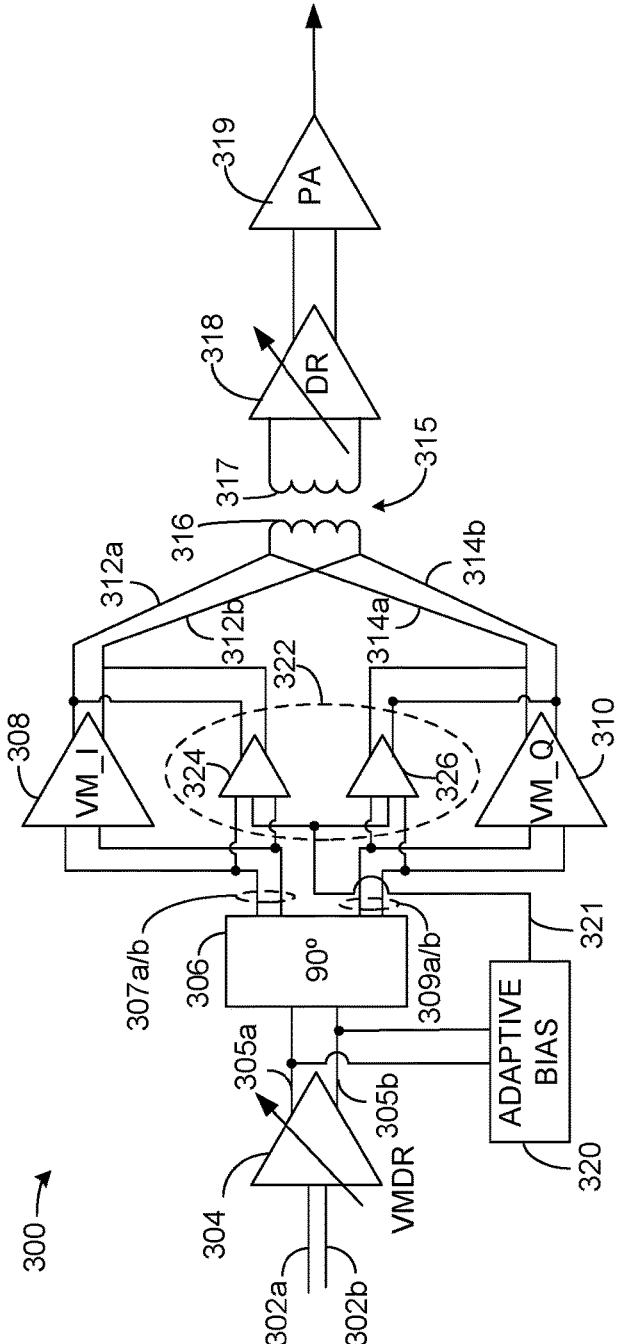
FIG. 3 shows a schematic diagram of a portion of a transmit circuit in accordance with exemplary embodiments of the disclosure.
Figure 3:
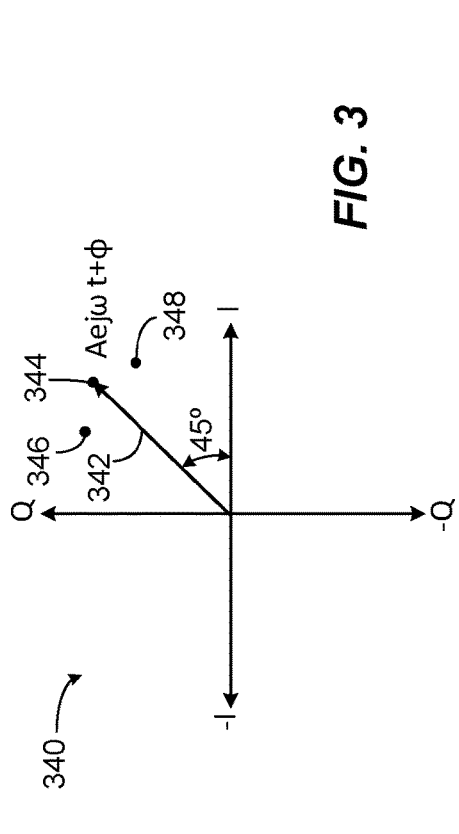

FIG. 3 shows a schematic diagram of a portion of a transmit circuit 300 in accordance with exemplary embodiments of the disclosure. The transmit circuit 300 may be wholly or partially implemented in a phased array element 287. The transmit circuit 300 comprises a vector modulator driver (VMDR) 304 configured to receive a differential input signal over differential connections 302a and 302b. The differential input signal on differential connections 302a and 302b may comprise a modulated information signal that is to be transmitted. The amplified differential output of the VMDR 304 is provided over differential connections 305a and 305b to a quadrature generator 306. In an exemplary embodiment, the quadrature generator 306 is configured to generate in phase (I) and quadrature (Q) signals I–, I+, Q– and Q+ from the amplified differential input signal on connections 305a and 305b. In an exemplary embodiment, the differential I– and I+ signals are provided over connections 307a and 307b to an in phase vector modulator (VM_I) 308 and the differential Q– and Q+ signals are provided over connections 309a and 309b to a quadrature vector modulator (VM_Q) 310. In an exemplary embodiment, the VM_I 308 and the VM_Q 310 adjust (or set) the amplitude of the input I–, I+, Q– and Q+ signals and provide amplitude adjusted I– and I+ signals over connections 312a and 312b to a magnetic circuit 315 and provide amplitude adjusted Q– and Q+ signals over connections 314a and 314b to the magnetic circuit 315, respectively.

In an exemplary embodiment, the magnetic circuit 315 may include an input or primary element 316 and an output or secondary element 317. The magnetic circuit 315 combines the I– and I+ signals on connections 312a and 312b with the Q– and Q+ signals on connections 314a and 314b and provides a combined signal as an input to a driver amplifier 318.

In a condition where the amplitudes of the signals on connections 312a and 312b and connections 314a and 314b are equal (that is, the I signals are exactly 90 degrees offset from the Q signals), the output of the magnetic circuit 315 represents a vector 342 that appears at exactly 45 degrees with respect to an I axis, shown on the graph 340. The point 344 represents the combination of the I– and I+ signals and the Q– and Q+ signals at the secondary element 317.

The driver amplifier 318 pre-amplifies the signal and a power amplifier 319 provides an amplified transmit signal to an antenna or an antenna array 248 (FIG. 2A, 2B, 2C).

In an exemplary embodiment, the transmit circuit 300 comprises an auxiliary vector modulator 322 having an auxiliary in phase vector modulator (aux VM_I) 324 and an auxiliary quadrature vector modulator (aux VM_Q) 326 connected to the output of the quadrature generator 306. In an exemplary embodiment, the aux VM_I 324 may comprise one or more additional circuit instances (sometimes referred to as slices) of the VM_I 308, and the aux VM_Q 326 may comprise one or more additional instances (or slices) of the VM_Q 310. The aux VM_I 324 and the aux VM_Q 326 may be configured as single-bit (a single instance or single slice of a VGA circuit) or multiple bit (multiple instances or multiple slices of a VGA circuit), depending on implementation.

In an exemplary embodiment, the transmit circuit 300 also includes an adaptive bias circuit 320 configured to adaptively bias the aux VM_I 324 and the aux VM_Q 326 responsive to the amplitude of the differential signals on connections 305a and 305b. The bias signal is provided to the aux VM_I 324 and to the aux VM_Q 326 over connection 321. Differential I– and I+ outputs of the aux VM_I 324 are connected to the connections 312a and 312b and differential Q– and Q+ outputs of the aux VM_Q 326 are connected to the connections 314a and 314b. In an exemplary embodiment, the aux VM_I 324 adjusts the output of the VM_I 308 on connections 312a and 312b and the aux VM_Q 326 adjusts the output of the VM_Q 310 on connections 314a and 314b responsive to the amplitude of the input signal on connections 305a and 305b and responsive to the gain applied by the aux VM_I 324 and the aux VM_Q 326.

Depending on the amplitude of the signal on connections 305a and 305b and depending on the gain applied by the aux VM_I 324 and the aux VM_Q 326 the adaptive bias circuit

320 may cause the aux VM_I 324 and the aux VM_Q 326 to adjust the amplitudes of the I signals on connections 312a and 312b and the Q signals on connections 314a and 314b so that the point 344 is moved toward the Q axis (as shown by point 346) or moved toward the I axis (as shown by point 348). For example, as the amplitude of the signal on connections 305a and 305b increases, the amplitudes of the outputs of the aux VM_I 324 and aux VM_Q 326 also proportionately increase, which together with adjusting the gain applied by the aux VM_I 324 and the aux VM_Q 326 causes a resultant change of the phase of the signal at the input to the driver amplifier 318, represented by point 346. Similarly, as the amplitude of the signal on connections 305a and 305b decreases, the amplitudes of the outputs of the aux VM_I 324 and aux VM_Q 326 also proportionately decrease, which together with adjusting the gain applied by the aux VM_I 324 and the aux VM_Q 326 causes a resultant change of the phase of the signal at the input to the driver amplifier 318, represented by point 348.

Figure 4:
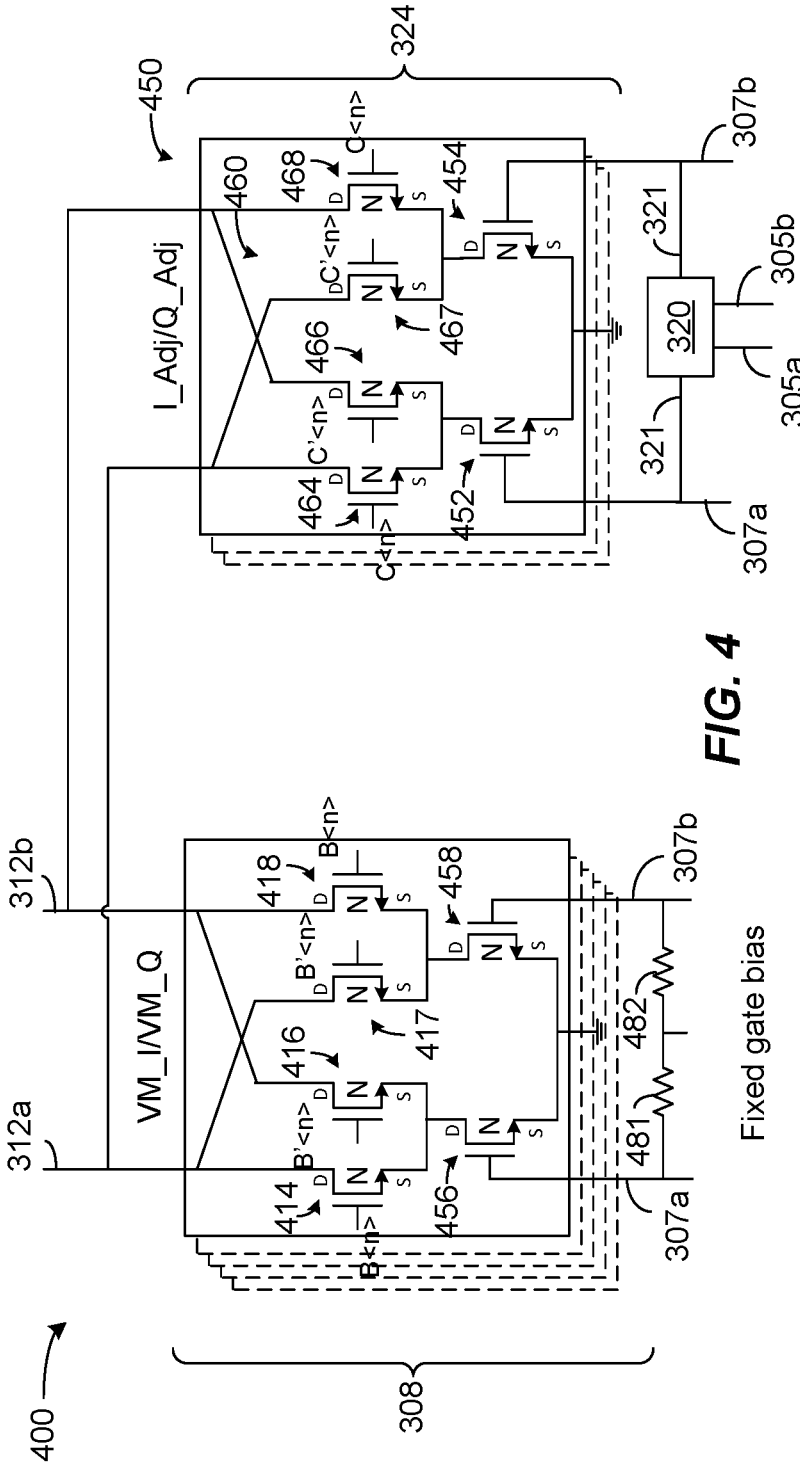
FIG. 4 is a schematic diagram of a variable gain amplifier (VGA) instance (slice) in accordance with exemplary embodiments of the disclosure.

FIG. 4 is a schematic diagram of a variable gain amplifier (VGA) instance (slice) in accordance with exemplary embodiments of the disclosure. The circuit 400 represents one instance of either the VM_I 308 or the VM_Q 310 of FIG. 3 and one instance of the aux VM_I 324 or the aux VM_Q 326 of FIG. 3. An instance of the VM_I 308 is shown in FIG. 4 for illustration only, with the understanding that there is also an instance of the VM_Q 310. Similarly, an instance of the aux VM_I 324 is shown in FIG. 4 for illustration only, with the understanding that there is also an instance of the aux VM_Q 326.

In an exemplary embodiment, the VM_I 308 may comprise transistors 456, 458, 414, 416, 417 and 418. In an exemplary embodiment, the transistors 456, 458, 414, 416, 417 and 418 may comprise N-type transistors. However, the transistors 456, 458, 414, 416, 417 and 418 may comprise P-type transistors, or devices fabricated using other processes.

In an exemplary embodiment, the transistors 456 and 458 may be configured to receive the differential input signals on connections 307a and 307b and a fixed gate bias through resistors 481, 482. The transistors 414, 416, 417 and 418 may be arranged in a cascode architecture with respect to the transistors 456 and 458. In an exemplary embodiment, the transistors 414 and 418 may be configured to receive a gate bias signal B<n> and the transistors 416 and 417 may be configured to receive a complementary gate bias signal B'<n>. The bias signals B<n> and B'<n> control the flow of current through the transistors 414, 416, 417 and 418 to allow a change in the gain of the VM_I 308 to adjust the phase of the output of the VM_I 308 on connections 312a and 312b.

In an exemplary embodiment, the aux VM_I 324 may comprise transistors 452, 454, 464, 466, 467 and 468. In an exemplary embodiment, the transistors 452, 454, 464, 466, 467 and 468 may comprise N-type transistors. However, the transistors 452, 454, 464, 466, 467 and 468 may comprise P-type transistors, or devices fabricated using other processes.

In an exemplary embodiment, the transistors 452 and 454 may be configured to receive an adaptive gate bias signal from the adaptive bias circuit 320 and the transistors 464, 466, 467 and 468 may be arranged in a cascode architecture with respect to the transistors 452 and 454. In an exemplary embodiment, the transistors 464 and 468 may be configured to receive a gate bias signal C<n> and the transistors 466 and 467 may be configured to receive a complementary gate bias signal C'<n>. The value and the polarity of the bias signals C<n> and C'<n> control the flow of current through the transistors 464, 466, 467 and 468 and allows obtaining the desired polarity and the amount of adaptive AM to PM distortion compensation provided by the aux VM_I 324 to the signals on connections 312a and 312b.

In an exemplary embodiment, the circuit 450 represents one instance of the aux VM_I 324 of FIG. 3. The adaptive bias circuit 320 provides a bias signal to the transistors 452 and 454 in the aux VM_I 324 based on the amplitude of the signal on connections 305a and 305b (FIG. 3). The output of the aux VM_I 324 on connections 312a and 312b combines with the outputs of the VM_I 308 to alter the amplitude of the signals on connections 312a and 312b responsive to the amplitude of the signals on connections 305a and 305b. The aux VM_I 324 may be a single-bit (in which case, a single instance (or slice) of the aux VM_I 324 would be implemented as shown in FIG. 4) or may be a multiple-bit implementation (in which case multiple instances (or slices)) would be implemented as shown in dotted lines.

In an exemplary embodiment, the aux VM_I 324 (and the aux VM_Q 326) does not influence the beamforming provided by the VM_I 308. The auxiliary amplitude correction provided by the aux VM_I 324 (and the aux VM_Q 326) is applied equally to all the elements of a phased array, so it does not influence the beam forming performed by a beam-forming array (not shown), that would include multiple instances of at least some portions of the transmit circuit 300 (FIG. 3).

A beamforming array may include multiple phase shifters in multiple transmit circuits (300 of FIG. 3). For example, multiple phase shifters may be arranged in a phased array (for example in the phase shift circuitry 281 of FIGS. 2B/2C), and the I VGA and Q VGA of each phase shifter are configured to provide a phase offset with respect to the signals provided by the I VGA and Q VGA of other phase shifters, while the aux VM_I and aux VM_Q of each phase shifter provide a common phase shift with respect to the signals provided by the aux VM_I and aux VM_Q of the other phase shifters.

In an exemplary embodiment, the aux VM_I/VM_Q 324 is adaptively biased by the adaptive bias circuit 320, while the VM_I/VM_Q 308 has a fixed gate bias applied to the transistors 456 and 458. As a result the amplitude dependent phase (dependent on the amplitude of the input signal on connections 305a and 305b) is created by the aux VM_I/VM_Q 324 using a weighted sum of currents through the transistors 464, 466, 467 and 468, which can compensate for AM-PM distortion introduced by the power amplifier 319 (FIG. 3) in any direction (phase lead/phase lag) without adding any additional loading to the input of the PA 319.

In an exemplary embodiment, the bias applied to the transistors 452 and 454 in the aux VM_I 324 is fixed, and the aux VM_I 324 provides a fixed phase offset on connections 312a and 312b that can be applied to all phase shifters in a phased array, allowing a phase-invariant gain control without affecting the beam steering provided by the VM_I 308 (and VM_Q 310).

A cascode arrangement 460 can be implemented in the aux VM_I 324 to control the output of the aux VM_I 324, in this example, to determine whether the amplitude of the I signals (or Q signals for the VM_Q 326 and aux VM_Q 326) are affected by the output of the aux VM_I 324. For example, if it is desired to affect only the Q signals, then the cascode arrangement 460 may be turned off so that the aux VM_I 324 does not affect the signal on connections 312a and 312b. Further, the cascode arrangement 460 also allows full 360 degree output phase control so that only an I+ (in this example) output or an I− (in this example) output may be provided from the aux VM_I 324 to the signals on the connections 312a and 312b.

Figure 5:
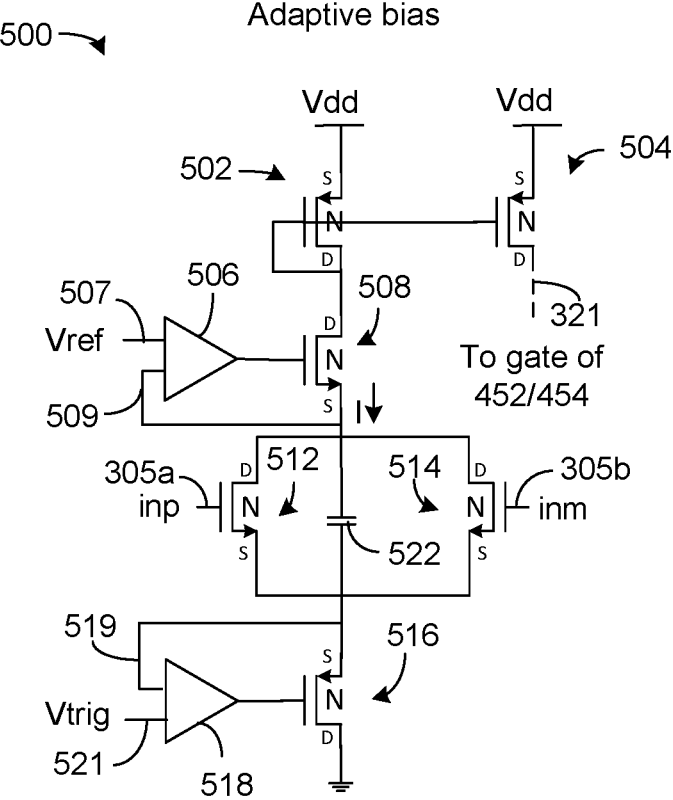
FIG. 5 is a schematic diagram showing a circuit as an example of the adaptive bias circuit of FIGS. 3 and 4 that can be used to bias the aux VM_I 324 and the aux VM_Q 326.

FIG. 5 is a schematic diagram showing a circuit 500 as an example of the adaptive bias circuit 320 of FIGS. 3 and 4 that can be used to bias the aux VM_I 324 and the aux VM_Q 326. In an exemplary embodiment, the circuit 500 includes a transistor 502 and a transistor 504 each having a source connected to a system voltage, Vdd. The drain of the transistor 504 is connected to the gates of the transistors 452 and 454 (FIG. 4).

The circuit 500 also includes a transistor 508, an amplifier 506, transistors 512 and 514, a transistor 516 and an amplifier 518. The drain of the transistor 502 is connected to the drain of the transistor 508. The source of the transistor 508 is connected to the drains of the transistors 512 and 514. The differential input signals on connections 305a and 305b are applied to the gates of the transistor 512 and 514. The sources of the transistors 512 and 514 are connected together and to the source of the transistor 516. The drain of the transistor 516 is connected to system ground. A capacitance 522 is connected between the drains of the transistors 512 and 514 and the sources of the transistors 512 and 514.

The transistors 512 and 514 act as a squaring circuit for the input inp/inm signals and are followed by low pass filtering provided by the capacitance 522. In this manner, a current, I, is generated proportional to the envelope of the amplitude of the inp/inm signals. That envelope current, I, is mirrored to the transistor 504, which generates an adaptive voltage on connection 321 proportional to the signal envelope and can be used to bias the transistors 452 and 454 of the aux VM_I 324 (FIG. 4).

For the squaring transistors 512 and 514 to operate reliably, a fixed voltage along with a low impedance may be provided at the source node of the transistor 508. This may be achieved by placing the transistor 508 in negative feedback using the amplifier 506. This helps set the source node of the transistor 508 the same as a reference voltage, Vref, provided at the input 507 of the amplifier 506. Since AM-PM distortion generally occurs at high voltage swing, for an input signal (inp/inm) below a certain threshold voltage, Vtrig, provided to the amplifier 518 on connection 521, it is possible to avoid generating an adaptive bias voltage. This is achieved by putting the transistor 516 in negative feedback using the amplifier 518 and selecting the trigger voltage, Vtrig, appropriately.

Figure 6:
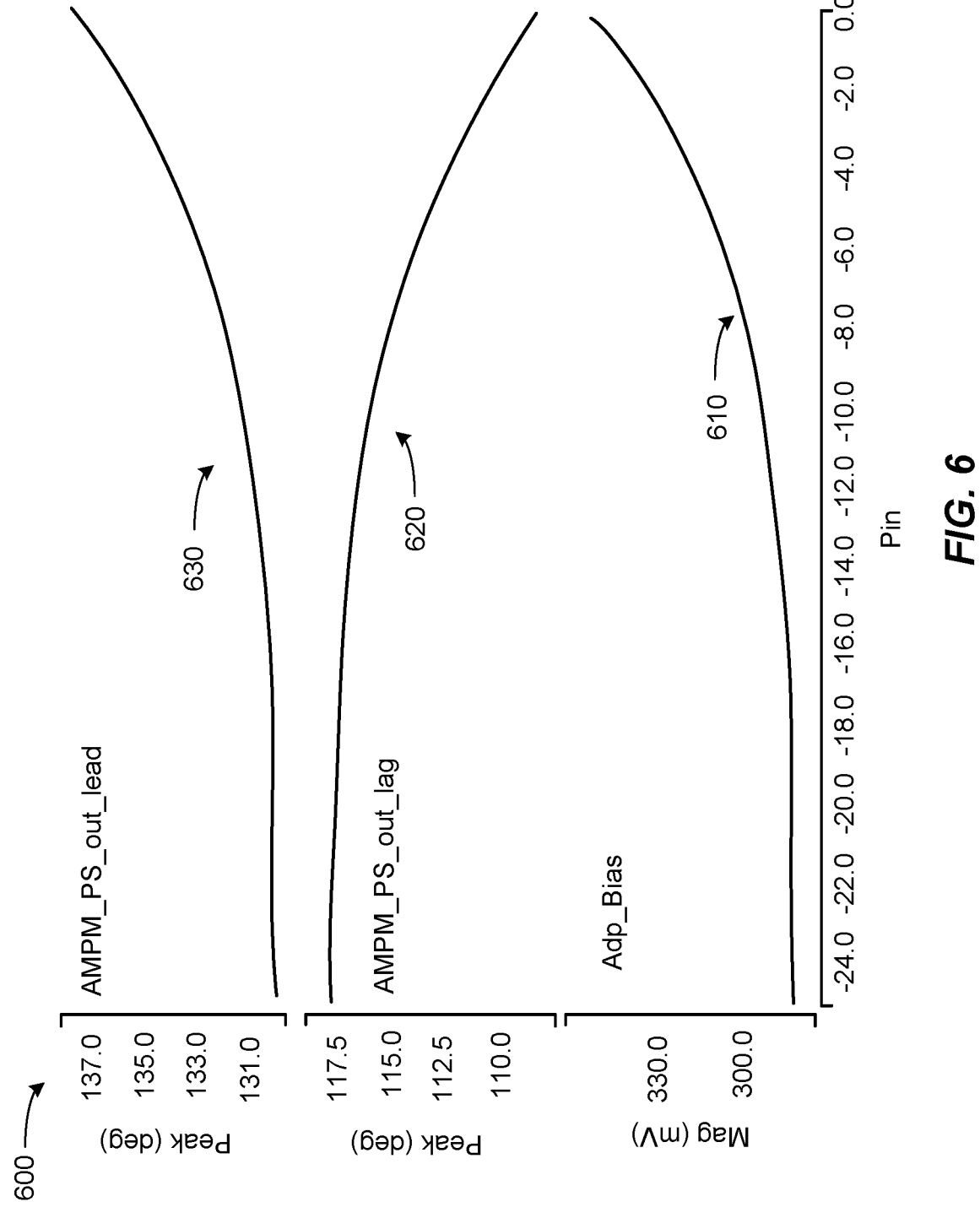
FIG. 6 is a series of graphs showing exemplary phase change as a result of the operation of the aux VM_I 324 and the aux VM_Q 326 of FIG. 3.

FIG. 6 is a series of graphs showing exemplary phase change as a result of the operation of the aux VM_I 324 and the aux VM_Q 326 of FIG. 3. The trace 610 shows the change in the adaptive bias signal responsive to input signal amplitude. The trace 620 shows a phase lag (for example, the point 348 (FIG. 3)) as a result of the output of the aux VM_I 324 adjusting the signal on connections 312a and 312b and the output of the aux VM_Q 326 adjusting the signal on connections 314a and 314b; and the trace 630 shows a phase lead (for example, the point 346 (FIG. 3)) as a result of the output of the aux VM_I 324 adjusting the signal on connections 312a and 312b and the output of the aux VM_Q 326 adjusting the signal on connections 314a and 314b. The phase adjustment provided by the aux VM_I 324 and the aux VM_Q 326 compensates for PA (319, FIG. 3) phase variation, may be configured such that it does not introduce any additional loading at the input of the PA 319, and is responsive only to input signal amplitude, thereby providing a phase-invariant gain control adjustment. In an exemplary embodiment, the aux VM_I 324 and the aux VM_Q 326 may be configured to provide a relatively small amount of phase adjustment to the signals on connections 312a and 312b and connections 314a and 314b, on the order of 5 degrees for example. Other amounts of phase adjustment are possible.

In an exemplary embodiment, at low power it is desirable to have a way to adjust gain, so that current consumption can be minimized. However, changing the gain also changes the phase, which is not desired. In such an embodiment, multiple-bit auxiliary VM_I 324 and auxiliary VM_Q 326 can be implemented to correct for the phase offset created by gain control.

Figure 7:
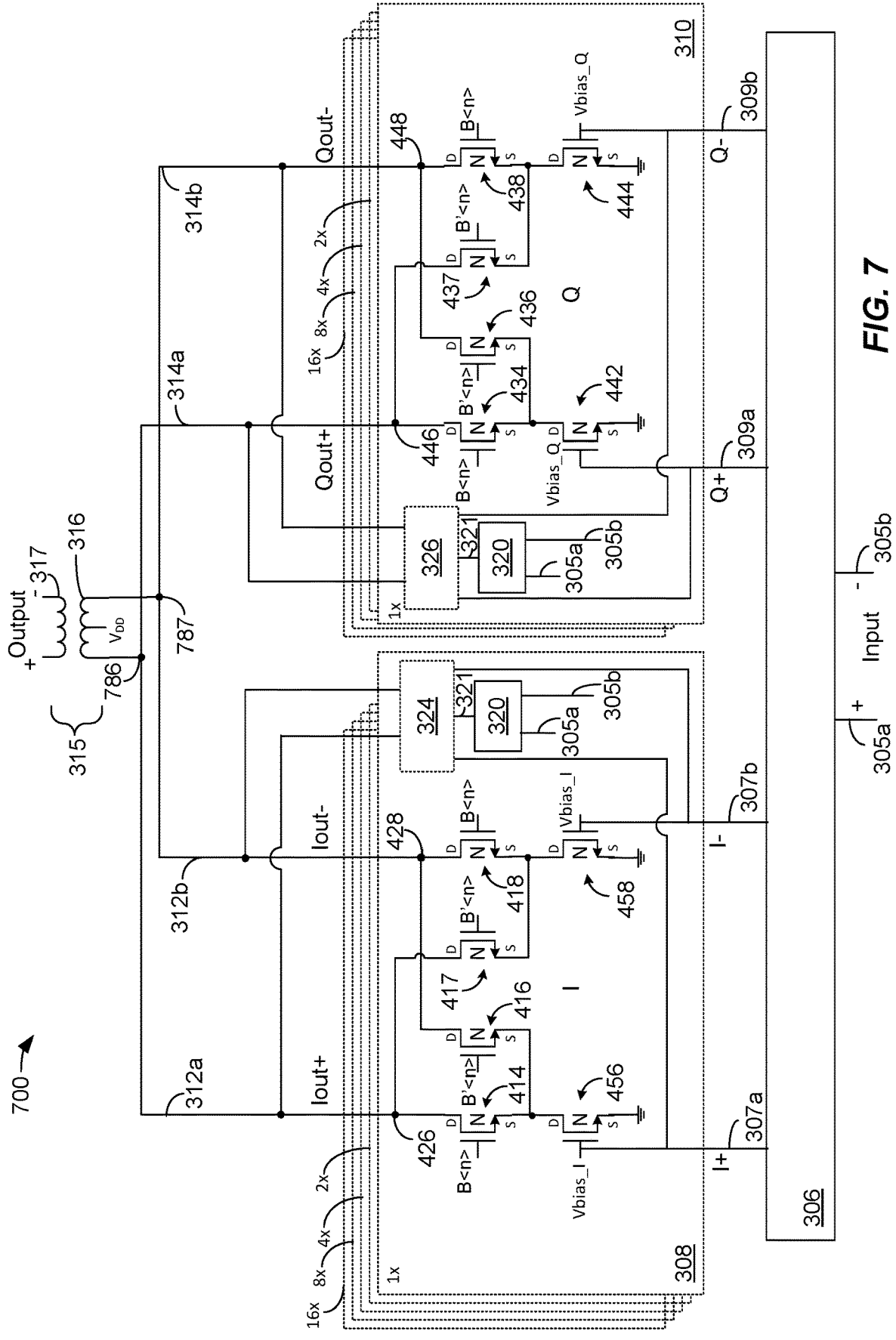
FIG. 7 is a schematic diagram of a phase shifter in accordance with an exemplary embodiment of the disclosure.

FIG. 7 is a schematic diagram of a phase shifter circuit in accordance with an exemplary embodiment of the disclosure. In an exemplary embodiment, the phase shifter circuit 700 comprises an in phase (I) quadrature (Q) (I/Q) generator 306, a VM_I 308, an aux VM_I 324, a VM_Q 310, an aux VM_Q 326, and a combining circuit 315. Details of the aux VM_I 324 and the aux VM_Q 326 are omitted from FIG. 7 for ease of illustration. Each of the VM_I 308, the VM_Q 310, the aux VM_I 324 and the aux VM_Q 326 use binary weighted device slices to create a weighted sum of I and Q signals. Binary weighting is one example, and other weighting may be used in other implementations. The number of bits for the VM_I 308 and the VM_Q 310 can be different than those of the aux VM_I 324 and the aux VM_Q 326. The resolution of the VM_I 308 and the VM_Q 310 determine the phased array beam steering resolution and in an exemplary embodiment may use 5 bits. The number of bits of resolution for the aux VM_I 324 and the aux VM_Q 326 is determined by how many degrees of the PA's AMPM correction is to be made and in exemplary embodiments may be three bits or one bit.

In an exemplary embodiment, the I/Q generator 306 may receive a differential input signal at connections 305a and 305b. In an exemplary embodiment, an in phase positive component (Iin+ or Iinp) of a differential signal may be provided on connection 307a and an in phase negative component (Iin−, or Iinn) of a differential signal may be provided on connection 307b.

In an exemplary embodiment, a quadrature positive component (Qin+ or Qinp) of a differential signal may be provided on connection 309a and a quadrature negative component (Qin−, or Qinn) of a differential signal may be provided on connection 309b.

In other embodiments, a single-ended signal may be provided to the I/Q generator 306 and differential signals may be created using, for example, a balun (not shown). The signals on connections 305a and 305b may come from a balun output or another element, for example an amplifier such as a VGA.

In an exemplary embodiment, the I/Q generator 306 may be implemented using a polyphase filter, a quadrature hybrid, a Lange coupler, or other lumped element equivalents at millimeter wave to sub-THz frequencies.

In an exemplary embodiment, the VM_I 308 includes transistors 456, 458, 414, 416, 417 and 418. In an exemplary embodiment, the transistors 414 and 418 may be referred to as "through" transistors and the transistors 416 and 417 may be referred to as "cross" transistors. In the example shown in FIG. 7, the transistors 456, 458, 414, 416, 417 and 418 are all N-type field effect transistors (N-FETs). However, the transistors 456, 458, 414, 416, 417 and 418 can alternatively be P-type FETs, or can be fabricated using other manufacturing technology and processes.

The drain of the transistor 414 is connected to the drain of the transistor 417, both of which are connected to node 426 and the connection 312a. The drain of the transistor 416 is connected to the drain of the transistor 418, both of which are connected to node 428 and the connection 312b.

The source of the transistors 414 and 416 are connected together and are connected to the drain of the transistor 456. The source of the transistor 456 is connected to system ground. The source of the transistors 417 and 418 are connected together and are connected to the drain of the transistor 458. The source of the transistor 458 is connected to system ground.

In an exemplary embodiment, the VM_Q 310 includes transistors 442, 444, 434, 436, 437 and 438. In an exemplary embodiment, the transistors 434 and 438 may be referred to as "through" transistors and the transistors 436 and 437 may be referred to as "cross" transistors. In the example shown in FIG. 7, the transistors 442, 444, 434, 436, 437 and 438 are all N-type field effect transistors (N-FETs). However, the transistors 442, 444, 434, 436, 437 and 438 can alternatively be P-type FETs, or can be fabricated using other manufacturing technology and processes.

The drain of the transistor 434 is connected to the drain of the transistor 437, both of which are connected to node 446 and the connection 314a. The drain of the transistor 436 is connected to the drain of the transistor 438, both of which are connected to node 448 and the connection 314b.

The source of the transistors 434 and 436 are connected together and are connected to the drain of the transistor 442. The source of the transistor 442 is connected to system ground. The source of the transistors 437 and 438 are connected together and are connected to the drain of the transistor 444. The source of the transistor 444 is connected to system ground.

An Iout+ output of the VM_I 308 is provided over connection 312a to the node 786, and an Iout− output of the VM_I 308 is provided over connection 312b to the node 787. A Qout+ output of the VM_Q 310 is provided over connection 314a to the node 786, and a Qout− output of the VM_Q 310 is provided over connection 314b to the node 787.

The adaptive bias circuit 320 is configured to receive the differential input signal over connections 305a and 305b and provide an adaptive bias signal over connection 321 to the aux VM_I 324. An Iout+ output of the aux VM_I 324 is provided over the connection 312a to the node 786. An Iout− output of the aux VM_I 324 is provided over the connection 312b to the node 787. Details of the aux VM_I 324 re omitted from FIG. 7 for ease of illustration.

The adaptive bias circuit 320 is configured to receive the differential input signal over connections 305a and 305b and provide an adaptive bias signal over connection 321 to the aux VM_Q 326. A Qout+ output of the aux VM_Q 326 is provided over the connection 314a to the node 786. A Qout− output of the aux VM_Q 326 is provided over the connection 314b to the node 787. Details of the aux VM_Q 326 re omitted from FIG. 7 for ease of illustration.

In an exemplary embodiment, the combining circuit 315 includes a first winding 316 and a second winding 317. The Iout+ output on connection 312a and the Qout+ output on connection 314a are provided to the node 786, which is connected to one side of the first winding 316. The Iout− output on connection 312b and the Qout− output on connection 314b are provided to the node 787, which is connected to the other side of the first winding 316. A center tap of the first winding 316 is connected to the system voltage $V_{DD}$.

The combining circuit 315 is illustrated as a transformer for illustrative purposes only. The combining circuit may be implemented in other ways, such as by using Wilkinson combiner, or other circuit.

The output of the combining circuit 315 is provided from the second winding 317 to, for example, the driver amplifier 318 of FIG. 3.

Figure 8:
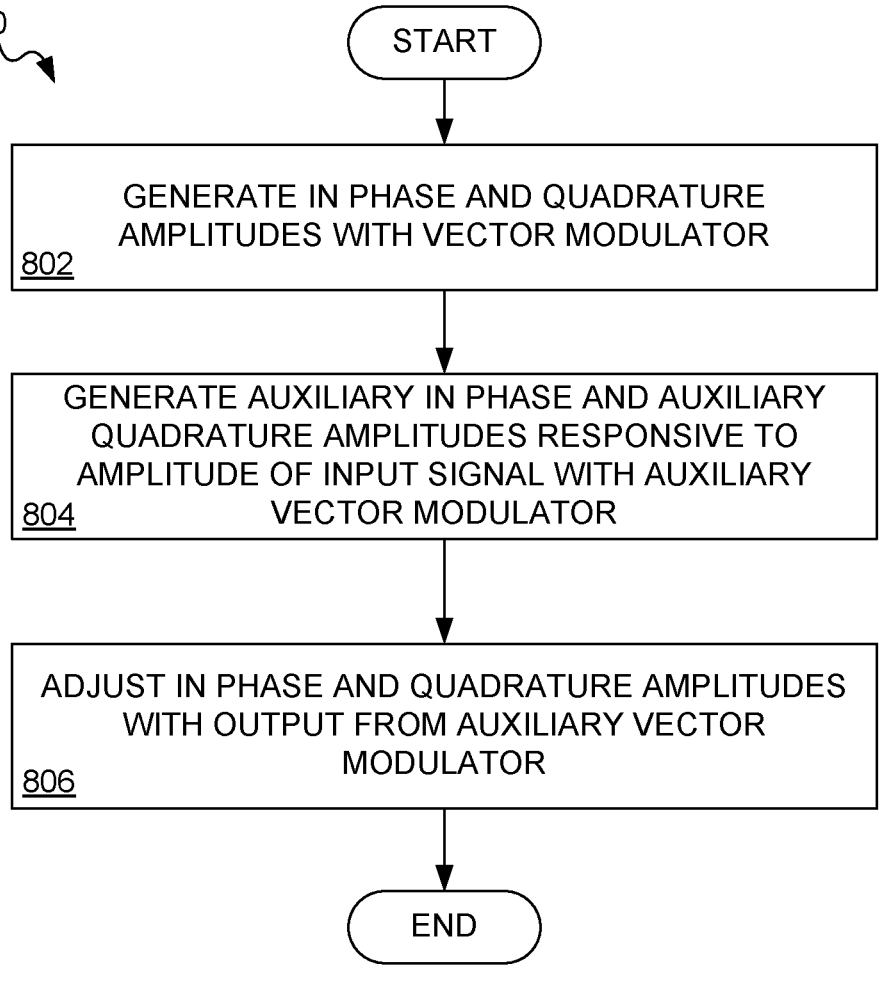
FIG. 8 is a flow chart describing an example of the operation of a method for signal transmission.

FIG. 8 is a flow chart 800 describing an example of the operation of a method for signal transmission. The blocks in the method 800 can be performed in or out of the order shown, and in some embodiments, can be performed at least in part in parallel.

In block 802, in phase and quadrature amplitudes are generated by a vector modulator. For example, the VM_I 308 may generate in phase amplitudes Iout+ and Iout− on connections 312*a* and 312*b* and the VM_Q 310 may generate quadrature amplitudes Qout+ and Qout− on the connections 314*a* and 314*b*.

In block 804, auxiliary in phase and auxiliary quadrature amplitudes are generated by an auxiliary vector modulator. For example, the aux VM_I 324 may generate auxiliary in phase amplitudes on connections 312*a* and 312*b* and the aux VM_Q 326 may generate auxiliary quadrature amplitudes on the connections 314*a* and 314*b*.

In block 806, the in phase amplitude and the quadrature amplitude are adjusted using the output of the auxiliary in phase vector modulator, aux VM_I, and the output of the auxiliary quadrature vector modulator, aux VM_Q. For example, the output of the aux VM_I 324 adjusts the amplitude of the output of the VM_I 308 on connections 312*a* and 312*b* and the output of the aux VM_Q 326 adjusts the amplitude of the output of the VM_Q 310 on connections 31*a* and 314*b*.

Figure 9:
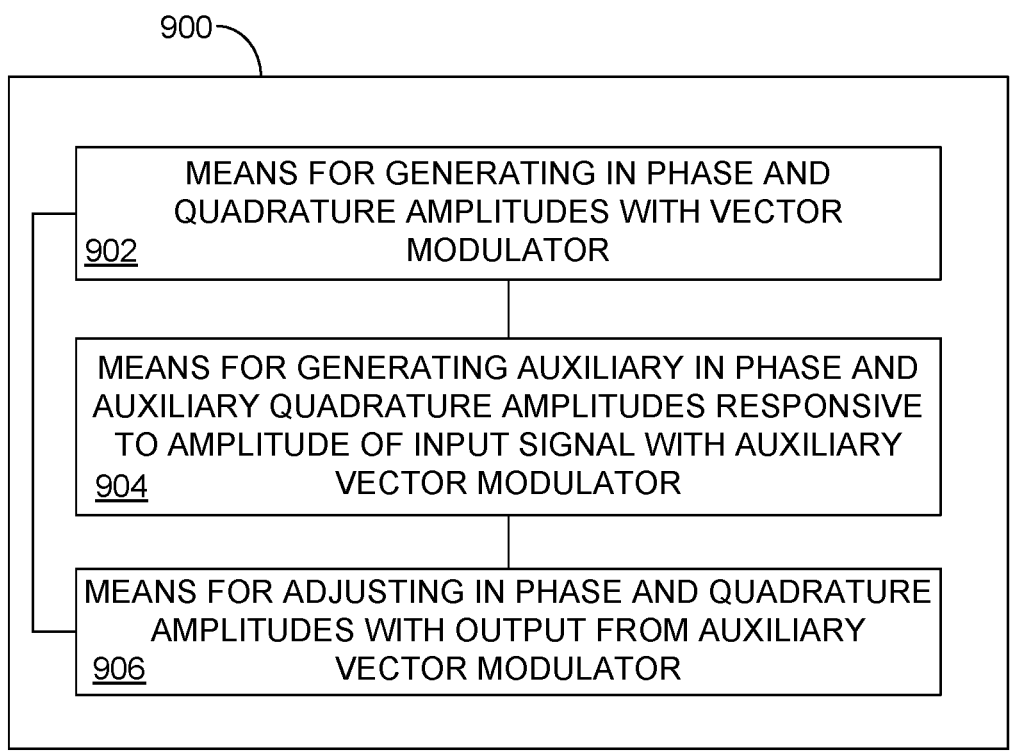
FIG. 9 is a functional block diagram of an apparatus for signal transmission.

FIG. 9 is a functional block diagram of an apparatus 900 for signal transmission. The apparatus 900 comprises means 902 for generating in phase and quadrature amplitudes. In certain embodiments, the means 902 for generating in phase and quadrature amplitudes can be configured to perform one or more of the functions described in operation block 802 of method 800 (FIG. 8). In an exemplary embodiment, the means 902 for generating in phase and quadrature amplitudes may comprise the VM_I 308 configured to generate in phase amplitudes Iout+ and Iout− on connections 312*a* and 312*b* and the VM_Q 310 configured to generate quadrature amplitudes Qout+ and Qout− on the connections 314*a* and 314*b*.

The apparatus 900 may also comprise means 904 for generating auxiliary in phase and auxiliary quadrature amplitudes. In certain embodiments, the means 904 for generating auxiliary in phase and auxiliary quadrature amplitudes can be configured to perform one or more of the functions described in operation block 804 of method 800 (FIG. 8). In an exemplary embodiment, the means 904 for generating auxiliary in phase and auxiliary quadrature amplitudes may comprise the aux VM_I 324 configured to generate auxiliary in phase amplitudes on connections 312*a* and 312*b* and the aux VM_Q 326 configured to generate auxiliary quadrature amplitudes on the connections 314*a* and 314*b*.

The apparatus 900 may also comprise means 906 for adjusting the in phase amplitude and the quadrature amplitude. In certain embodiments, the means 906 for adjusting the in phase amplitude and the quadrature amplitude can be configured to perform one or more of the functions described in operation block 806 of method 800 (FIG. 8). In an exemplary embodiment, the means 906 for adjusting the in phase amplitude and the quadrature amplitude may comprise the coupling of the output of the aux VM_I 324 and the output of the VM_I 308 on connections 312*a* and 312*b*, and the coupling of the output of the aux VM_Q 326 and the output of the VM_Q 310 on connections 314*a* and 314*b*.

Implementation examples are described in the following numbered clauses:

1. A phase shifter, comprising: a quadrature generator configured to generate an in phase (I) signal and a quadrature (Q) signal from an input signal; an in phase vector modulator (VM_I) configured to receive the I signal and a quadrature vector modulator (VM_Q) configured to receive the Q signal; and an auxiliary VM_I connected to the VM_I and an auxiliary VM_Q connected to the VM_Q, the auxiliary VM_I configured to receive the I signal, the auxiliary VM_Q configured to receive the Q signal, the auxiliary VM_I and the auxiliary VM_Q configured to receive a bias signal and configured to adjust an in phase amplitude output of the VM_I and a quadrature amplitude output of the VM_Q responsive to the bias signal.

2. The phase shifter of clause 1, wherein the bias signal is a fixed bias signal.

3. The phase shifter of clause 1, wherein the bias signal is an adaptive bias signal responsive to a level of the 1 input signal.

4. The phase shifter of any of clauses 1 through 3, wherein the auxiliary VM_I and the auxiliary VM_Q comprise cascode devices configured to adjust a direction of a phase rotation of a combined output of the VM_I and the VM_Q.

5. The phase shifter of any of clauses 1 through 4, wherein the auxiliary VM_I and the auxiliary VM_Q comprise a single bit architecture.

6. The phase shifter of any of clauses 1 through 5, wherein the auxiliary VM_I and the auxiliary VM_Q comprise a multiple bit architecture.

7. The phase shifter of any of clauses 1 through 6, wherein the phase shifter is arranged in a phased array including multiple phase shifters, and the VM_I and the VM_Q of each phase shifter are configured to provide a phase offset with respect to the signals provided by the VM_I and the VM_Q of other phase shifters, while the auxiliary VM_I and the auxiliary VM_Q of each phase shifter provide a common phase shift with respect to the signals provided by the auxiliary VM_I and the auxiliary VM_Q of the other phase shifters.

8. The phase shifter of any of clauses 3 through 7, wherein the adaptive bias signal compensates for the amplitude modulation (AM) to phase modulation (PM) distortion of a power amplifier.

9. The phase shifter of any of clauses 3 through 7, wherein the adaptive bias signal is generated by a bias circuit responsive to an input signal of the bias circuit being above a threshold voltage.

10. The phase shifter of any of clauses 1 through 9, further comprising a vector modulator driver amplifier configured to receive the input signal.

11. The phase shifter of any of clauses 1 through 10, further comprising a combining circuit configured to combine the adjusted output of the VM_I and the adjusted output of the VM_Q.

12. A method for signal transmission, comprising: generating an in phase (I) amplitude and a quadrature (Q) amplitude based on an input signal; generating an auxiliary in phase amplitude and an auxiliary quadrature amplitude based on the input signal and a gain signal; and adjusting the in phase amplitude using the auxiliary in phase amplitude and adjusting the quadrature amplitude using the auxiliary quadrature amplitude.

13. The method of clause 12, further comprising adjusting the in phase amplitude and adjusting the quadrature amplitude responsive to a bias signal.

14. The method of clause 13, wherein the bias signal is fixed.

15. The method of clause 13, wherein the bias signal is adaptive responsive to a level of a differential input signal.

16. The method of clause 15, further comprising adjusting the in phase amplitude and adjusting the quadrature amplitude to one of a lead or lag vector associated with the in phase amplitude and the quadrature amplitude.

17. The method of any of clauses 12 through 16, further comprising generating the auxiliary in phase amplitude and the auxiliary quadrature amplitude using a single bit architecture.

18. The method of any of clauses 12 through 16, further comprising generating the auxiliary in phase amplitude and the auxiliary quadrature amplitude using a multiple bit architecture.

19. A device, comprising: means for generating an in phase (I) amplitude and a quadrature (Q) amplitude based on an input signal; means for generating an auxiliary in phase amplitude and an auxiliary quadrature amplitude based on the input signal and a gain signal; and means for adjusting the in phase amplitude using the auxiliary in phase amplitude and adjusting the quadrature amplitude using the auxiliary quadrature amplitude.

20. The device of clause 19, further comprising means for adjusting the in phase amplitude and adjusting the quadrature amplitude responsive to a bias signal.

21. The device of clause 20, wherein the bias signal is fixed.

22. The device of clause 20, wherein the bias signal is adaptive responsive to a level of a differential input signal.

23. The device of clause 22, further comprising means for adjusting the in phase amplitude and means for adjusting the quadrature amplitude to one of lead or lag vector associated with the in phase amplitude and the quadrature amplitude.

24. A transmit circuit, comprising: a vector modulator driver amplifier configured to receive a differential input signal; a quadrature generator configured to generate a differential in phase (I) signal and a differential quadrature (Q) signal from the differential input signal; an in phase vector modulator (VM_I) configured to receive the differential I signal and a quadrature vector modulator (VM_Q) configured to receive the differential Q signal; an auxiliary VM_I connected to the VM_I and an auxiliary VM_Q connected to the VM_Q the auxiliary VM_I configured to receive the differential I signal, the auxiliary VM_Q configured to receive the differential Q signal, the auxiliary VM_I and the auxiliary VM_Q configured to receive a bias signal and configured to adjust an in phase output of the VM_I and a quadrature output of the VM_Q responsive to the bias signal; and a combining circuit configured to combine the adjusted output of the VM_I and the adjusted output of the VM_Q.

25. The transmit circuit of clause 24, wherein the bias signal is a fixed bias signal.

26. The transmit circuit of clause 24, wherein the bias signal is an adaptive bias signal responsive to a level of the differential input signal.

27. The transmit circuit of any of clauses 24 through 26, wherein the auxiliary VM_I and the auxiliary VM_Q comprise cascode devices configured to adjust a direction of a phase rotation of the combined adjusted output of the VM_I and the VM_Q.

28. The transmit circuit of any of clauses 24 through 27, wherein the auxiliary VM_I and the auxiliary VM_Q comprise a single bit architecture.

29. The transmit circuit of any of clauses 24 through 27, wherein the auxiliary VM_I and the auxiliary VM_Q comprise a multiple bit architecture.

30. The transmit circuit of clause 26, wherein the adaptive bias signal compensates for the amplitude modulation (AM) to phase modulation (PM) distortion of a power amplifier.

31. The transmit circuit of clause 26, wherein the adaptive bias signal is generated by a bias circuit responsive to an input signal of the bias circuit being above a threshold voltage.

32. A phase shifter, comprising: a quadrature generator configured to generate an in phase (I) signal and a quadrature (Q) signal from an input signal; a first in phase vector modulator configured to receive the I signal and a first quadrature vector modulator configured to receive the Q signal, wherein the first in phase vector modulator and the first quadrature vector modulator are coupled to a fixed bias; and a second in phase vector modulator configured to receive the I signal and a second quadrature vector modulator configured to receive the Q signal, wherein the second in phase vector modulator and the second quadrature vector modulator are coupled to an adaptive bias.

33. The phase shifter of clause 32, wherein outputs of the first in phase vector modulator and the second in phase vector modulator are connected together, and outputs of the first quadrature vector modulator and the second quadrature vector modulator are connected together.

34. The phase shifter of clause 32, wherein the adaptive bias varies based on an amplitude of the input signal.

35. A phased array comprising a plurality of phase shifters configured to be coupled to an input signal and respective antennas, each of the phase shifters comprising: a first vector modulator configured to receive the input signal and generate an output signal having a phase difference relative to output signals from other phase shifters in the phased array; and a second vector modulator configured to receive the input signal and generate an output signal having a phase common to other output signals from the other phase shifters in the phased array.

36. The phase shifter of clause 35, wherein the second vector modulator is coupled to an adaptive bias.

37. The phase shifter of clause 36, wherein the adaptive bias varies based on an amplitude of the input signal.

38. The phase shifter of clause 35, wherein the second vector modulator is coupled to a fixed bias.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar- CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A phase shifter, comprising:
a quadrature generator configured to generate an in phase (I) signal and a quadrature (Q) signal from an input signal;
an in phase vector modulator (VM_I) configured to receive the I signal and a quadrature vector modulator (VM_Q) configured to receive the Q signal; and
an auxiliary VM_I connected to the VM_I and an auxiliary VM_Q connected to the VM_Q, the auxiliary VM_I configured to receive the I signal, the auxiliary VM_Q configured to receive the Q signal, the auxiliary VM_I and the auxiliary VM_Q configured to receive a bias signal at respective inputs of the auxiliary VM_I and the auxiliary VM_Q and configured to adjust an in phase amplitude output of the VM_I and a quadrature amplitude output of the VM_Q responsive to the bias signal.

2. The phase shifter of claim 1, wherein the bias signal is a fixed bias signal.

3. The phase shifter of claim 1, wherein the bias signal is an adaptive bias signal responsive to a level of the input signal.

4. The phase shifter of claim 1, wherein the auxiliary VM_I and the auxiliary VM_Q comprise cascode devices configured to adjust a direction of a phase rotation of a combined output of the VM_I and the VM_Q.

5. The phase shifter of claim 1, wherein the auxiliary VM_I and the auxiliary VM_Q comprise a single bit architecture.

6. The phase shifter of claim 1, wherein the auxiliary VM_I and the auxiliary VM_Q comprise a multiple bit architecture.

7. The phase shifter of claim 1, wherein the phase shifter is arranged in a phased array including multiple phase shifters, and the VM_I and the VM_Q of each phase shifter are configured to provide a phase offset with respect to the signals provided by the VM_I and the VM_Q of other phase shifters, while the auxiliary VM_I and the auxiliary VM_Q of each phase shifter provide a common phase shift with respect to the signals provided by the auxiliary VM_I and the auxiliary VM_Q of the other phase shifters.

8. The phase shifter of claim 3, wherein the adaptive bias signal compensates for the amplitude modulation (AM) to phase modulation (PM) distortion of a power amplifier.

9. The phase shifter of claim 3, wherein the adaptive bias signal is generated by a bias circuit responsive to an input signal of the bias circuit being above a threshold voltage.

10. The phase shifter of claim 1, further comprising a vector modulator driver amplifier configured to receive the input signal.

11. The phase shifter of claim 1, further comprising a combining circuit configured to combine the adjusted output of the VM_I and the adjusted output of the VM_Q.

12. A method for signal transmission, comprising:
generating an in phase (I) amplitude and a quadrature (Q) amplitude based on an input signal;
generating an auxiliary in phase amplitude and an auxiliary quadrature amplitude based on the input signal and a gain signal, the gain signal corresponding to the auxiliary in phase amplitude and the auxiliary quadrature amplitude; and
adjusting the in phase amplitude using the auxiliary in phase amplitude and adjusting the quadrature amplitude using the auxiliary quadrature amplitude.

13. The method of claim 12, further comprising adjusting the in phase amplitude and adjusting the quadrature amplitude responsive to a bias signal.

14. The method of claim 13, wherein the bias signal is fixed.

15. The method of claim 13, wherein the bias signal is adaptive responsive to a level of a differential input signal.

16. The method of claim 15, further comprising adjusting the in phase amplitude and adjusting the quadrature amplitude to one of a lead or lag vector associated with the in phase amplitude and the quadrature amplitude.

17. The method of claim 12, further comprising generating the auxiliary in phase amplitude and the auxiliary quadrature amplitude using a single bit architecture.

18. The method of claim 12, further comprising generating the auxiliary in phase amplitude and the auxiliary quadrature amplitude using a multiple bit architecture.

19. A device, comprising:
means for generating an in phase (I) amplitude and a quadrature (Q) amplitude based on an input signal;
means for generating an auxiliary in phase amplitude and an auxiliary quadrature amplitude based on the input signal and a gain signal, the gain signal corresponding to the auxiliary in phase amplitude and the auxiliary quadrature amplitude; and
means for adjusting the in phase amplitude using the auxiliary in phase amplitude and adjusting the quadrature amplitude using the auxiliary quadrature amplitude.

20. The device of claim 19, further comprising means for adjusting the in phase amplitude and adjusting the quadrature amplitude responsive to a bias signal.

* * * * *